United States Patent [19]

Schoenfeld et al.

[11] 4,078,252

[45] Mar. 7, 1978

[54] RAMP GENERATOR

[75] Inventors: Simon L. Schoenfeld; Eugene C. Coussens, both of San Jose, Calif.

[73] Assignee: Signetics Corporation, Sunnyvale, Calif.

[21] Appl. No.: 757,767

[22] Filed: Jan. 10, 1977

Related U.S. Application Data

[63] Continuation of Ser. No. 602,570, Aug. 7, 1975, abandoned.

[51] Int. Cl.² .................... G06F 15/34; H03K 1/14
[52] U.S. Cl. ........................ 364/858; 307/264; 307/269; 364/518; 364/829
[58] Field of Search .............. 235/150.53, 183, 197; 328/181, 185; 307/246, 294, 264–269

[56] References Cited

U.S. PATENT DOCUMENTS

| | | | |
|---|---|---|---|
| 3,549,874 | 12/1970 | Vachitis | 235/183 |
| 3,577,007 | 5/1971 | Cross | 328/181 |
| 3,603,981 | 9/1971 | Rollenhagen | 235/197 |
| 3,701,993 | 10/1972 | Geerling | 328/185 |
| 3,883,756 | 5/1975 | Dragon | 307/246 |

Primary Examiner—Malcolm A. Morrison
Assistant Examiner—Errol A. Krass
Attorney, Agent, or Firm—C. Richard Pfeiffer; William H. Dana; Jerry A. Dinardo

[57] ABSTRACT

A ramp generator for driving a bar graph display which utilizes a feedback circuit to set its maximum level of the ramp.

4 Claims, 5 Drawing Figures

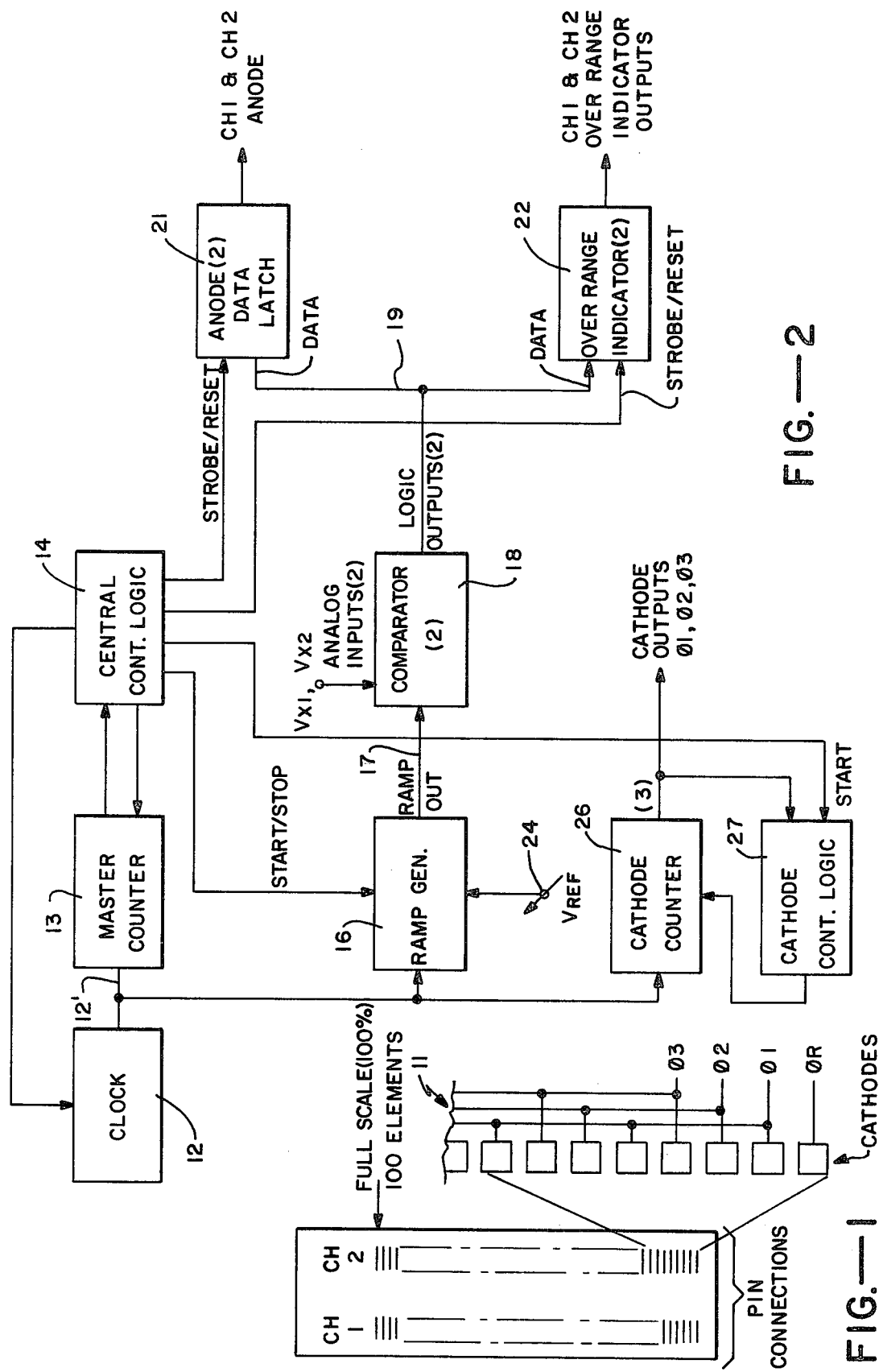
FIG.—2
FIG.—1

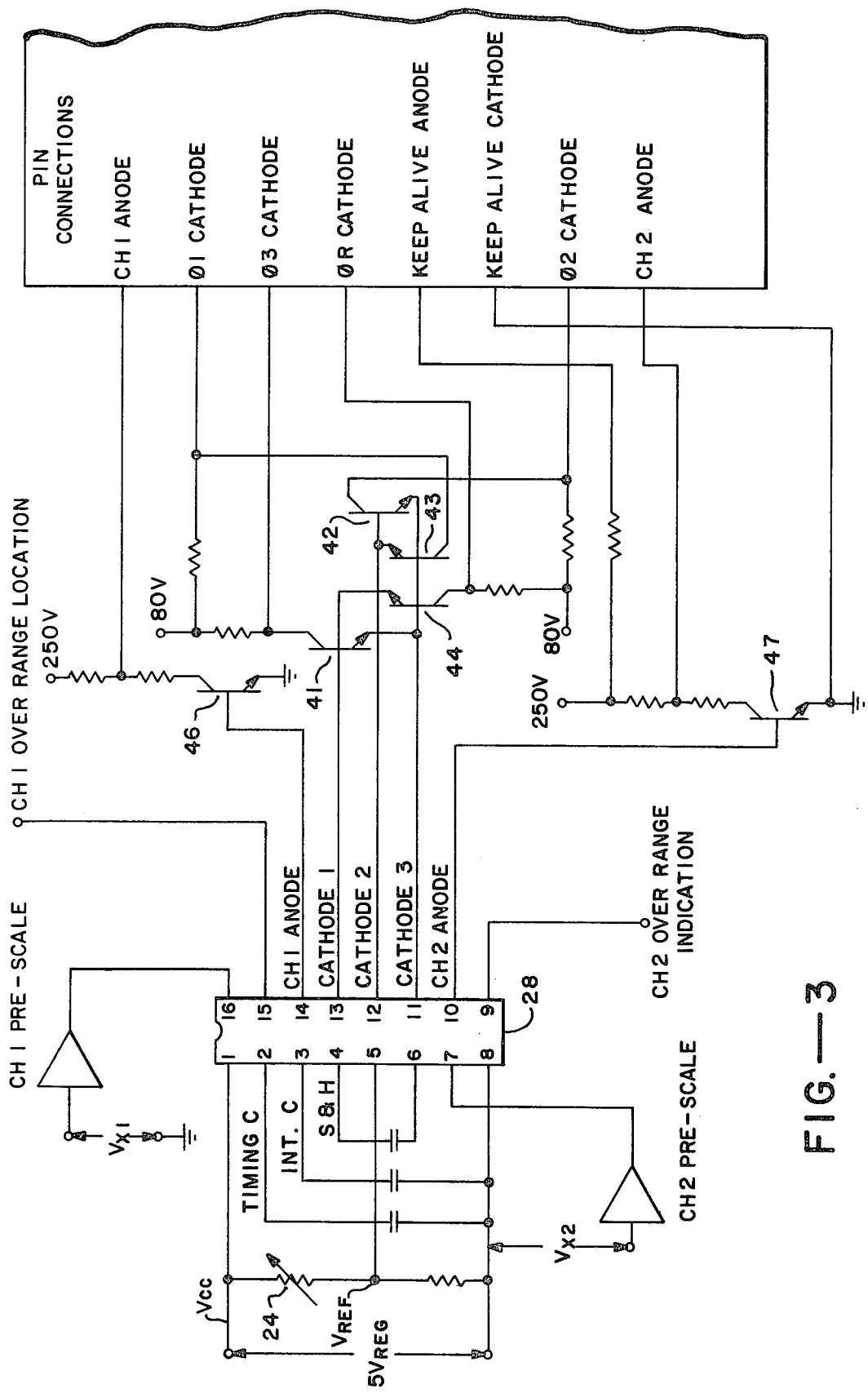
FIG.—3

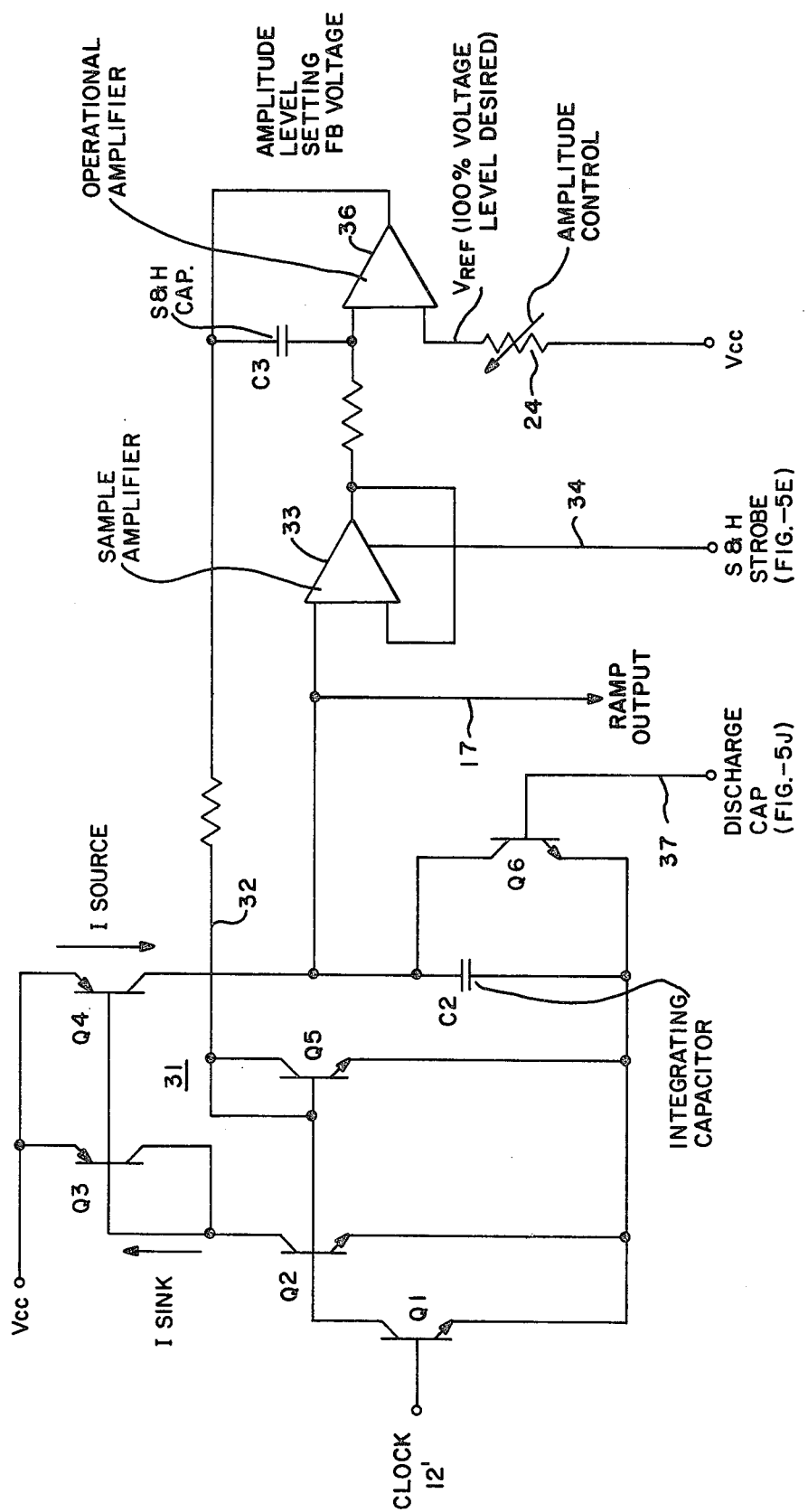
FIG.—4

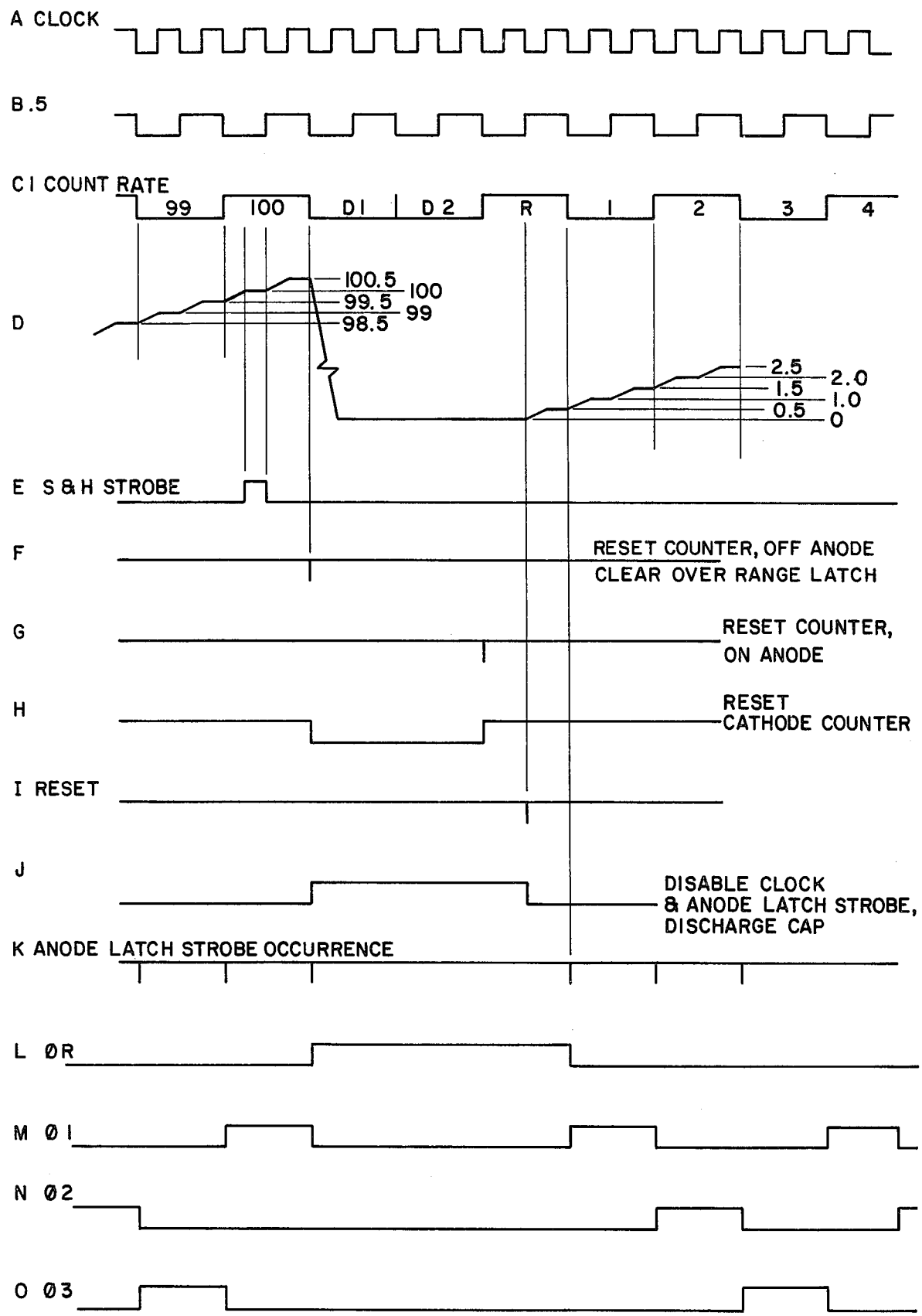
FIG.—5

RAMP GENERATOR

This is a continuation, of application Ser. No. 602,570 filed Aug. 7, 1975, and now abandoned.

BACKGROUND OF THE INVENTION

The present invention is directed to a ramp generator and more particularly to a ramp generator for use in a signal processing system for a bar graph display.

In a typical bar graph display as shown in FIG. 1, two separate bar graphs #1 and #2, have 100 elements. These elements are in actuality gas tubes which may be activated to produce a glowing or illuminated bar length which is proportional to an unknown analog input signal. The display elements are activated by a three phase system indicated at 11 where in the scanning mode of, for example, 70 hertz or greater the three phases are successively activated. A particular segment or element can only be activated if the previous element has already been activated. Thus, the display will produce at a normal viewing distance a continuous but precisely controlled bar length. The display anodes are switched on and off at an appropriate clock count to determine the heighth of the bar. Such switching is determined by comparing the unknown analog signal with a reference voltage ramp.

All of the foregoing is produced and sold by the Burroughs Corporation, Electronic Component Division, P.O. Box 1226, Plainfield, New Jersey 07061.

One of the difficulties in the foregoing circuit is the ramp generator. Normally, the generator must be frequently calibrated and other efforts must be made to insure its accuracy. In the case of an integrating circuit where tolerance variations must be accommodated, it is very difficult ot economically construct a sufficient ramp generator.

OBJECTS AND SUMMARY OF THE INVENTION

It is, therefore, a general object of the present invention to provide a ramp generator which is especially suited for integration.

It is another object of the invention to provide an integrated ramp generator which is suitable for driving a bar graph display.

In accordance with the above objects there is provided a ramp generator with a clock. A constant current source has an output signal turned on and off by the clock and includes means for adjusting the magnitude of the output signal. An integrating capacitor is connected to the current source and integrates the output signal to produce a voltage ramp. Sample and hold means sample and hold the voltage ramp at a time determined by a predetermined clock count and compare the held votage with a reference voltage to produce an error signal indicating a lack of comparison. Adjusting means are coupled to the sample and hold means and are responsive to the error signal for changing the magnitude of the current output signal to minimize the error signal. Means are responsive to the predetermined count for discharging the capacitor.

BRIEF DESCRIPTION OF THE DRAWINGS

FIG. 1 is a plan view of a bar graph display;
FIG. 2 is a block diagram of the signal processing system for driving the display of FIG. 1;
FIG. 3 shows the novel integrated circuit of the present invention along with suitable circuits for interfacing to the bar graph of FIG. 1;
FIG. 4 is a more detailed circuit schematic of a ramp generator shown in FIG. 2; and
FIGS. 5A through 5O is a timing diagram useful in understanding the present invention.

DETAILED DESCRIPTION OF THE PREFERRED EMBODIMENT

The bar graph of FIG. 1 has alread been discussed in conjunction with the prior art. Moreover, the pin connections at the lower portion of the figure will be discussed in conjunction with FIG. 3.

FIG. 2 is a generalized block diagram of the driving circuit for the bar graph of FIG. 1 and comprises a clock 12 for driving a master counter 13 which in turn drives a central control logic unit 14. The ramp generator 16 is activated by the control logic unit 14 to produce a voltage ramp output signal on line 17 which is connected to a comparator 18. The comparator compares a pair of unknown analog voltage inputs $V_{x1}$ and $V_{x2}$ and upon comparison produces a pair of logic outputs on lines 19. These are coupled to a pair of anode data latches 21 which drive channel 1 and channel 2 anodes of the bar graph display. If no comparison results, over range indicators 22 are activated.

Ramp generator 16 has its reference voltage adjusted by a variable input 24 in accordance with the maximum full scale analog signal $V_{x1}$ and $V_{x2}$ which is to be received. Cathode counter 26 in conjunction with cathode control logic unit 27 provides three cathode outputs which sequentially drive the bar graph display of FIG. 1 as discussed above.

The interface between the display drive and the bar graph is shown. In FIG. 3 all of the components of FIG. 2 are contained in the integrated circuit package 28. As is apparent it has channel 1 and channel 2 anode outpus, three cathode outputs $\phi1$, $\phi2$ and $\phi3$ and channel 1 and channel 2 Over Range Indicators. From an input standpoint the unkown voltages $V_{x1}$ and $V_{x2}$ are applied to channel 1 and channel 2 inputs through external prescale amplifiers. $V_{reference}$ is obtained by the use of the potentiometer 24 which utilizes the regulated 5 volt $V_{cc}$. Lastly, various timing capacitors, integrating capacitors and sample and hold capacitors are externally connected to circuits which will be described in detail in FIG. 4. The three phase cathode outputs, Q1-3, provide coded timing information which is decoded by external base-emitter diodes of cathode drive transistors 41-44 to provide the timing as indicated by the collector waveform shown in FIGS. 5L, M, N and O. The channel 1 and channel 2 anode outputs provide the drive to the high voltage interface transistors 46 and 47.

FIG. 4 illustrates the specific details of the ramp generator 16 in accordance with the present invention. Clock input 12' drives constant a current source 31 which is of the current mirror type. It has an input transistor Q1 which is response to an on condition of the clock signal inhibits $I_{sink}$ current through transistor Q2 and diode connected transistor Q3 by pulling the base of transistors Q2 and Q5 below their level of operation. $I_{sink}$ is the reflection of current in Q5. Such current is reflected at $V_{cc}$ as $I_{source}$ through the transistor Q4, which has its base connected to Q3, by the current mirror effect. $I_{source}$ is coupled to integrating capacitor C2 which produces a voltage ramp output on the line 17 (see FIG. 2). The constant current source 31 also includes means for adjusting the magnitude of the $I_{sink}$ and $I_{source}$ by means of a diode connected transistor Q5 which has its base in common with the base of Q2. Thus, the level of the voltage signal on collector line 32 affects the amplitude of the current source.

Ramp output line 17 is connected to sample and hold means which include a sample amplifier 33 which samples as determined by the strobe input on line 34. The output of amplifier 33 or the sampled signal is stored in sample and hold capacitor C3, the sampled signal drives the operational amplifier 36. Such amplifier acts as a comparator to compare the sampled ramp voltage on capacitor C2 to a reference voltage, $V_{ref}$, produced by amplitude control unit 24 to produce on line 32 a feedback voltage which tends to minimize any error.

Lastly, the discharge capacitor input control line 37 activates a transistor Q6 to short out integrating capacitor C2 and in essence dump its charge at an appropriate time in the sequence.

FIGS. 5A through 5O illustrate the timing of all of the foregoing. The clock frequency of clock 12 is indicated at FIG. 5A, is partially divided at 5B and finally at 5C is shown the count rate which corresponds to the number of segments of the display. It is also one-half the clock frequency. This clock rate is provided by a divider, referring to FIG. 2, in the central control logic unit 14. Typical ramps are indicated in FIG. 5D. The end of one ramp is indicated as occurring at 100 or more accurately 100.5 and the beginning of a second ramp is indicated starting at zero and going to 2.5 in relation to FIG. 5C. By use a clock count as in FIG. 5A which is double the number of segments, comparison decisions can be made in an intermediate point on the ramp as shown by the sample and hold strobe of FIG. 5E (the input 34 of FIG. 4).

At the predetermined count of 100 shown in FIG. 5C a general resetting of all circuits occurs since the ramp has reached its full scale value. Thus, in FIG. 5F the falling edge of FIG. 5C causes a reset pulse to reset the master counter 13 (FIG. 2), the over range indicator circuit 22 and causes the anode channel to switch an off condition. FIG. 5H shows a reset of the cathode counter 26; in FIG. 5J the clock 12 is disabled along with the anode latch strobe and in addition the integrating capacitor is discharged as illustrated by the input 37 of FIG. 4. FIG. 5K illustrates the occurrence of the anode latch strobe at the count rate and how it is inhibited as illustrated in FIG. 5J during the deadtime D1, D2. Lastly, FIG. 5L indicates that only the reset phase (see FIG. 1) of the bar graph is activated in the deadtime but in view of no anode voltage there cannot be any illumination.

Initiation of the next succeeding ramp occurs after the deadtimes D1 and D2 illustrated in FIG. 5C by the reset period R which is provided by the central control logic unit 14. The leading edge of this period causes the reset pulse of 5G which again resets the master counter 13. The cathode counter is also reset as shown in FIG. 5H. One half period later in FIG. 5I a reset pulse is produced which activates circuitry such as a flip-flop (not shown) as illustrated in FIG. 5J to enable the clock and anode latch strobe and disable the discharge capacitor circuit. Thus as shown in FIG. 5K the anode voltage is again applied to produce illuminated bar segments. Also at this time the C1, 2 and 3 scanning signals of FIGS. 5M, N and O are allowed to sequence.

The ramp generator of FIG. 4 in operation provides a circuit of the type which may be easily integrated as shown by the package 28 of FIG. 3. This is true because of the noncriticality of the components in view of the feedback circuits used to set the maximum level of the ramp. The ramp being produced in this manner dramatically corrects for temperature variations and excessive tolerance variations. The only critical portion is that the reference voltage must be carefully controlled. Also the reference voltage would be adjusted for each specific full scale voltage range desired.

The clock frequency of clock 12 is also adjusted for the particular number of segments of a bar graph display. Thus, for a 200 segment display its frequency would be doubled.

What is claimed is:

1. A ramp generator system providing an output proportional to an analog signal input comprising a clock having a predetermined frequency, a constant current source having an ouput signal turned on and off by said clock, said source including means for adjusting the magnitude of said output signal, an integrating capacitor connected to said current source and integrating said output signal to produce a voltage ramp, sample and hold means for sampling and holding said voltage ramp at a time determined by a predetermined clock count and for comparing said held voltage amplitude with a reference voltage input amplitude to produce an error signal defined by the difference in the respective amplitudes, said adjusting means being coupled to said sample and hold means and responsive to said error signal for changing said magnitude of said current source output signal to minimize said error signal, and means responsive to said predetermined count for discharging said capacitor.

2. A signal processing system for a bar graph display having a predetermined number of elements which displays an analog input signal as a proportional bar length and includes a ramp generator providing an output proportional to a reference voltage input and a comparator for comparing said analog signal to said ramp generator output for activating a corresponding number of said elements, said ramp generator comprising a clock having a predetermined frequency, a constant current source having an output signal turned on and off by said clock, said source including means for adjusting the magnitude of said output signal, an integrating capacitor connected to said current source and integrating said output signal to produce a voltage ramp, sample and holding means for sampling and holding said voltage ramp at a time determined by a predetermined clock count and for comparing said held voltage amplitude with the reference voltage input amplitude to produce an error signal defined by the difference in the respective amplitude, said adjusting means being coupled to said sample and hold means and responsive to said error signal for changing said magnitude of said current output signal to minimize said error signals, and means responsive to said predetermined count for discharging said capacitor.

3. A system as in claim 2 where said predetermined clock count is directly proportional to said predetermind number of elements.

4. A system as in claim 3 where said clock count is twice said number of elements.

* * * * *